United States Patent [19]

Smith

[11] 4,025,869
[45] May 24, 1977

[54] SOLID STATE AMPLIFIER
[75] Inventor: Leland Bryan Smith, Arlington Heights, Ill.
[73] Assignee: Beckman Instruments, Inc., Fullerton, Calif.
[22] Filed: Apr. 12, 1976
[21] Appl. No.: 676,014
[52] U.S. Cl. .............................. 328/162; 307/297; 328/151; 330/9; 330/59
[51] Int. Cl.² .......................................... H04B 1/12
[58] Field of Search .......... 328/151, 162, 163, 165, 328/167; 307/297; 330/9, 59

[56] References Cited
UNITED STATES PATENTS

| | | | |
|---|---|---|---|
| 3,516,002 | 6/1970 | Hillis | 330/9 X |
| 3,735,273 | 5/1973 | Wright et al. | 328/162 X |
| 3,764,922 | 10/1973 | Gilbert et al. | 328/162 |
| 3,801,919 | 4/1974 | Wilkes et al. | 330/9 |

*Primary Examiner*—John Zazworsky
*Attorney, Agent, or Firm*—R. J. Steinmeyer; P. R. Harder; D. A. Streck

[57] ABSTRACT

An amplifier capable of operation in four modes singly or in combinations is disclosed. The modes are: DC amplification mode, AC amplification mode, suppressed baseline mode, and offset correction mode. In the DC amplification mode, the amplifier operates as a conventional DC amplifier. In the suppressed baseline mode, the outputs of the input and output amplifiers are connected back to their input stages through a long time constant integrator resulting in the suppression of any DC output voltage. In the AC amplification mode an RC decoupling network is inserted in the inputs to the input amplifier means to pass AC signals and reject DC components. In the offset correction mode, the inputs of the input and isolator amplifier means are shorted to create zero differential at the summing junctions thereof. Any offset voltage present at the output of the input amplifier means or output amplifier means is suppressed by means of integrated feedback to the input stage of the input and output amplifier means. The offset correction mode is entered periodically and at the end of the offset correction mode, all connections revert back to their normal condition. The offset correction voltage attained is applied until the next offset correction period at which time new correction values are determined. Additionally, means for accomplishing the above functions are disclosed employing solid state switching, photon coupled isolation, and a floating power supply.

16 Claims, 4 Drawing Figures

SOLID STATE AMPLIFIER

BACKGROUND OF THE INVENTION

DC amplfiers are well known and widely used. For example, attention is directed to U.S. Pat. No. 3,370,242 dated Feb. 20, 1968, which is assigned to the same assignee as the present application. In a DC amplifier with high gain and high common mode rejection capabilities, zero drift is a problem. The task of eliminating drift has traditionally been accomplished by a mechanical chopper. The chopper is used to produce an amplitude modulated carrier frequency which lies outside the signal bandpass. To date, a chopper stabilized DC amplifier employing solid state circuitry has alluded successful accomplishment. This is due to offset voltages for bipolar transistor choppers and high resistance for field effect transistors.

Additionally, certain considerations must be made when designing a DC amplifier. These include:
1. Voltage offset.
2. Offset current.
3. Common mode rejection.
4. Noise suppression.
5. Drift with temperature.

Each of these considerations has been mastered singly to a high degree, but not in combination. Generally, the requirements of prime importance to the application are maximized and the balance are eliminated from the performance specifications or accepted at a lower criteria level.

Therefore, it is the object of the present invention to provide a solid state amplifier responding to the requirements of all the above enumerated considerations to a high degree of performance excellence.

SUMMARY OF THE INVENTION

The above objectives have been achieved by a solid state amplifier having the performance characteristics of a 1 KC mechanical chopper stabilized amplifier. This is accomplished by a novel approach wherein the signal input to the amplifier is never interrupted during the application of a correction factor to the amplifier. When not in the correcting mode, the amplifier acts and responds as a normal amplifier. Periodically, the amplifier is put in the correcting mode by a correction rate generator. A correction factor is applied by interrupting the signal to the output portion of the amplifier and maintaining the output of the amplifier through a track and hold circuit in its holding state. The normal feedback loop is then opened and the inputs to the amplifier are shorted together to put the summing junction at zero differential. If everything were working perfectly the output of the amplifier would be zero. A second integrating feedback loop is then established which applies a correction factor at the input stage. The second integrating feedback loop is driven by the amplifier output. This causes the amplifier to be driven by the correction factor being applied to the input stage by the integrating feedback loop to a state where its output is at the desired zero reference level. The input to the integrating correction factor feedback loop from the amplifier output is then removed leaving the correction feedback loop applying the attained correction factor to the input stage. The primary feedback loop is re-established, and the inputs unshorted. After a sufficient delay for noise and transients induced by this sequence to dissipate, the track and hold circuit is returned to the track state from the hold state and the output reflects the corrected input signal once again. This correction sequence is repeated at a rate within the bandpass of the amplifier.

Photon isolation is employed to isolate the input portion from ground and from the sample and hold portion. A second integrating feedback loop operating in a manner similar to the above is employed in conjunction with the photon coupled amplifier to compensate for errors induced thereby.

DESCRIPTION OF THE PREFERRED EMBODIMENT

Figure 2:
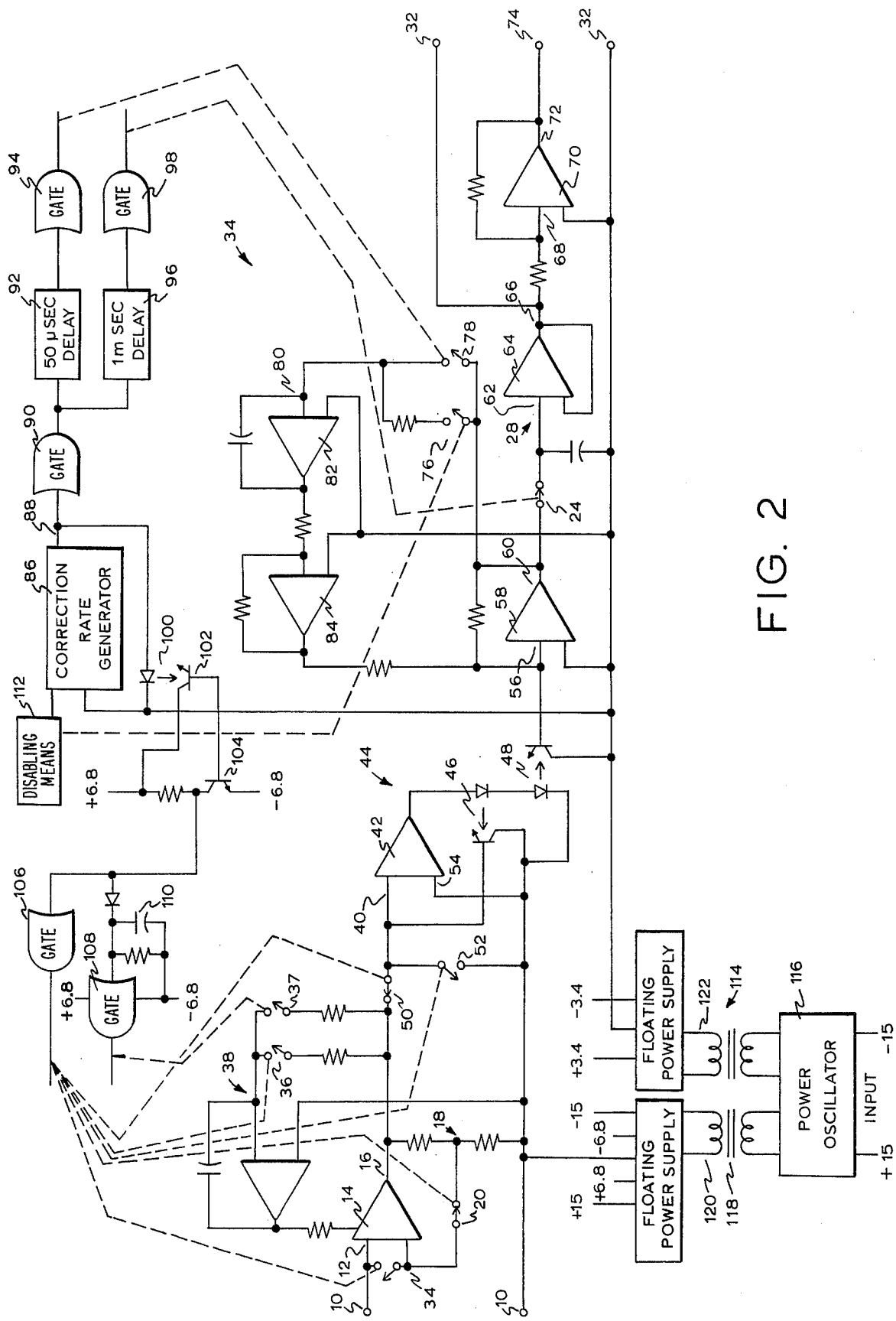
FIG. 2 is a more detailed circuit diagram of one method of assembling an amplifier according to the present invention.

The present amplifier, to be hereinafter described in greater detail, is capable of operation in four modes, singly and in various combinations. The basic mode of operation is the DC amplification mode in which the amplifier operates as a conventional DC amplifier. The amplifier would be in this mode when configured as shown in FIG. 2 and with the switches positioned as drawn therein. Periodic switching to the offset correction mode can be added, which will cause the amplifier to switch from the DC amplification mode to the offset correction mode on a periodic basis to calculate a new offset value which is then fed back to the input stage to correct for any offset present in the amplifier from drift or the like. If an RC decoupling network is inserted in the input to the amplifier of FIG. 2 to pass AC signals and reject DC components, the amplifier is placed in the AC amplification mode. The AC amplification mode, like the DC amplification mode, can also be combined with the offset correction mode. When the amplifier is put in the suppressed baseline mode, the feedback amplifiers used by the offset correction mode are used to connect the outputs of the input and output amplifiers back to their input stages through a long time constant integrator resulting in the suppression of any DC output voltage.

Because the amplifier automatically switches to the suppressed baseline mode when the means for periodically switching to the offset correction mode is disabled, the amplifier will normally be in one of four mode combinations depending on the configuration selected: DC amplification/offset correction; DC amplification/suppresssed baseline; AC amplification/offset correction; or, AC amplification/suppressed baseline.

Figure 1:
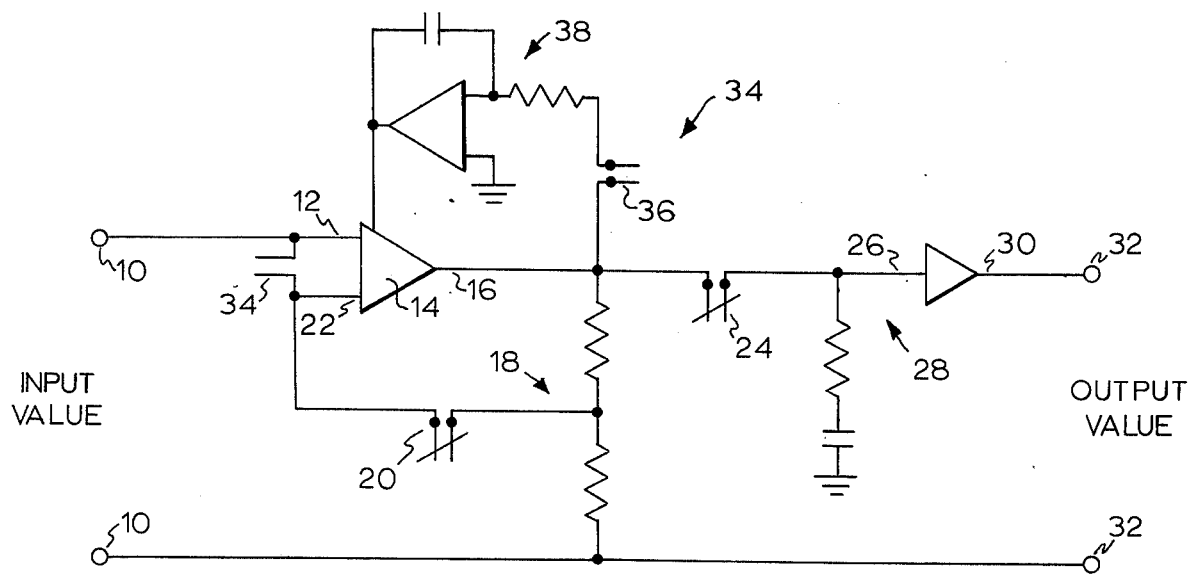
FIG. 1 is a simplified diagram of an amplifier according to the present invention.

The present amplifier utilizes a combination of solid state switching and an analog memory element to stabilize voltage offsets due to component changes with temperature and time. The process is accomplished by a timed sequence which cycles between the operating mode (DC or AC amplification) and the offset correction mode at a frequency which is included in the linear bandpass of the amplifier thus reducing the noise and the currents injected through the inputs from capacitance during switching. Referring to FIG. 1, this is accomplished by the following sequence. The input value is applied across input terminals 10. The input value appearing at input terminals 10 is applied to one input 12 of amplifier 14. Amplifier 14 is of the type well known in the art typified by U.S. Pat. No. 3,370,242 wherein two inputs are provided to opposite sides of a summing junction. When the two inputs are equal, there is no differential across the summing junction and the output of the amplifier is zero. Means are additionally provided at the input stage thereof for the insertion of a compensation signal, normally through feedback from the output. If a signal is applied to one input and the output is fed back to the other input or the place for compensation signal at the input stage, such an amplifier will amplify the signal to the point where the output being fed back places the summing junction at zero differential.

The output 16 of amplifier 14 is applied to a feedback circuit generally indicated as 18 containing normally closed switch 20 to the other input 22 of amplifier 14 and, additionally, through normally closed switch 24 to the input 26 of a track and hold circuit generally indicated at 28. The output 30 of track and hold circuit 228 appears across output terminals 32 as the output of the amplifier circuit generally indicated as 34. Periodically, the following stabilizing or correction sequence to switch from the operating mode to the offset correction mode and back again is initiated. Normally closed switch 24 is opened whereupon the track and hold circuit 28 which had been in the track state goes to the hold state and maintains the output value across output terminals 32 at the instantaneously attained value. Normally closed switch 20 is opened to open the normal feedback circuit 18 of amplifier 14. Normally opened switch 34 across input terminals 12 and 22 of amplifier 14 is closed to short the inputs to amplifier 14 and place the summing junction at zero differential which would, in the absence of offset, cause the output to go to zero. Normally opened switch 36 is closed causing the output 16 of amplifier 14 to be applied to the input of a second feedback loop circuit generally indicated as 38 which is connected to the input stage of amplifier 14. Second feedback loop 38 is a high loop gain active integrator. The feedback signal from integrating feedback loop 38 developed in response to the output of amplifier 14 acts to drive the output 16 of amplifier 14 to a reference level of zero by balancing the signal across the summing junction. When sufficient time has passed to allow the amplifier 14 to stabilize, switch 36 is opened to remove the input to second feedback loop 38 which then continues to apply the attained correction value at the input stage. Switch 20 is closed to reinstitute normal feedback circuit 18, and switch 34 is opened to unshort the inputs to amplifier 14. After a brief delay to allow the dissipation of transients caused by the opening and closing of the various switches, switch 24 is closed putting track and hold circuit 28 back in the track state and amplifier 14 resumes its normal signal amplification with the new correction factor being applied at the input stage.

This basic operation and additional features to accomplish the various objectives of the present invention are set forth in greater detail in FIG. 2. Referring now to FIG. 2, the input value across input terminals 10 appears at input 12 of amplifier 14. In its preferred embodiment, input amplifier 14 is a three stage amplifier made up of discrete components in the manner of U.S. Pat. No. 3,370,242. The first or input stage is a differential field effect amplifier. A monolithic dual field effect transistor is chosen for low noise, offset current and minimum offset voltage changes with temperature. Two current sources are provided. One is fixed and the second is a variable current stage providing a feedback input point. The varible current stage is varied by means of the integrator feedback loop 38 in order to provide offset correction across the summing junction of the amplifier. The second stage is a differential transistor stage with an active load to provide high voltage gain. The third stage is an emitter follower to provide low output impedance with unity voltage gain. Ideally, the input stage of amplifier 14 is protected against high input voltages by means of diode connected transistors shunted across the inputs 10. These transistors limit the maximum input voltage to about 1.3 volts. Additionally, the drain to source voltage of the input stage is regulated to 10 volts by zener diodes. These circuits and techniques are all well known to persons skilled in the art and form no part of the present invention. Switch 34 used to short the input to amplifier 14 during offset correction and switch 20 which is utilized to open and close the normal feedback loop 18 of amplifier 14 are MOS field effect transistors.

The output 16 of the emitter follower third stage of amplifier 14 is applied to input 40 of isolator amplifier 42. Isolator amplifier 42 is part of an isolator circuit generally indicated as 44 and is an integrated circuit driving a matched pair of photon coupled isolators 46 and 48 as shown. By the use of a matched set of isolators, one in the feedback circuit and one in the forward circuit, it is possible to compensate for the inherent nonlinearity of the photon coupled isolator. Switch 50 is provided in the line connecting the output 16 of amplifier 14 to the input 40 of isolator amplifier 42. Additionally, switch 52 is connected between the first input 40 and the second input 54 of isolator amplifier 42. During the offset correction mode as described above in relation to FIG. 1, when switch 34 and switch 36 are closed, normally closed switch 50 is opened to remove the output 16 of amplifier 14 from the input 40 of isolation amplifier 42 and normally open switch 52 is closed to short the inputs 40 and 54 of isolation amplifier 42 to provide offset correction to correct for errors induced by photon isolator circuit 44 in a manner to be described hereinafter.

The phototransistor current from the second photon coupled isolator 48 is fed into the input 56 of output amplifier 58. The output 60 of output amplifier 58 is applied through switch 24 to the input 62 of track and hold amplifier 64 being a part of the track and hold circuit 28. The output 66 of track and hold amplifier 64 appears at output terminal 32 as the output of amplifier 34 and is applied to the input 68 of inverter 70. The output 72 of inverter 70 is connected to negative output terminal 74 and provides an inverted output of amplifier 34. In addition to being applied to the input 62 of track and hold amplifier 64, the output 60 of output amplifier 58 is applied through switch 76 and switch 78 to the input 80 of integrator 82. The integrator 82 followed by a phase inverter 84 is used to provide an offset correction voltage which is connected back to the input 56 of output amplifier 58. When switch 50 is opened and switch 52 is closed in the offset correction mode, the output of isolator amplifier 42 should go to zero since the inputs 40 and 54 are shorted to give zero differential at the summing junction. Likewise, the zero output should appear at the input 56 of output amplifier 58 to give a zero output at output 60 thereof. If drift or error occurs in any of the components involved, output 60 will not be zero. With switch 76 closed, the non-zero output will drive the integrator 82 to provide a compensation at input 56 which will make output 60 equal zero. When switch 76 is opened at the end of the correction mode, this correction factor will remain applied at input 56 until the next correction mode time.

All the switches designated and employed in FIGS. 1 and 2 of the present application are solid state switches. With the exception of switch 34 and 20 previously designated as being MOS field effect transistors, the switches are CMOS switches. All the switches are driven by gates according to any of the techniques and employing appropriate solid state components well known to those skilled in the art as indicated by the dotted line connections on the drawing between the individual switches and their associated gate. The gates operate in response to a correction rate generator 86 and associated additional circuitry as follows. In the preferred embodiment, correction rate generator 86 is a multi-vibrator containing unequal feedback for a negative output so that a low duty cycle output is obtained in a manner well known in the art. It is preferred that correction rate generator 86 provide a signal at output 88 which will cause the error correction mode to be on for about 0.45 milliseconds and off for about 45 milliseconds. This output 88 is applied to gate 90 and thence through a 50 microsecond delay circuit 92 to gate 94 and through a 1 millisecond delay circuit 96 to gate 98. Fifty microsecond delay circuit 92 provides a 50 microsecond delay to the start of the input 80 of integrator 82 to allow the transients of input amplifier 14 to settle out. The 1 millisecond delay provided by 1 millisecond delay circuit 96 assures that the track and hold circuit 28 will remain in the hold state until the amplifier transients at the end of the error correction mode have had time to settle out.

The 0.45 to 45 millisecond correction time to correction rate ratio and the 50 microsecond and one millisecond delays represent values used in one successful embodiment of the present invention and do not represent unique points of novelty in and of themselves. The novelty of the present invention in regard to correction rate is the fact that the correction rate lies within the bandpass of the amplifier. The correction rate chosen is a function of the temperature drift rate and the magnitude of the $1/f$ noise. The slower the correction rate, the less often the correction factor is applied and, consequently, the higher the correction value must be. On the other hand, the less often the switching from the operating mode to the correction mode occurs, the less current will be injected into the inputs from the capacitance present in the switching. The injected current, of course, merely adds to the error present in the amplifier and it is desirable to reduce it as much as possible. The values chosen approach the slowest rate viable to produce a correction factor at the sub-microvolt level which was a design criteria. The result is a solid state amplifier having a correction rate within the bandpass of the amplifier that responds as would an amplifier having a conventional one KC chopper.

Likewise, the 50 microsecond and 1 millisecond delays represent the times for the dissipation of noise and transients in the equipment used in a tested embodiment. The only criteria placed on these delay times is that they allow sufficient time for noise and transients, induced by the above described switching sequence attendant to changing from the normal operating mode and the track state to correction mode and back, to be dissipated before the appropriate circuits are reconnected.

In order to maintain the complete isolation with respect to ground of the circuitry associated with input amplifier 14 and isolator amplifier 42 prior to the second photon coupled isolator 48, the output 88 of correction rate generator 86 is applied to a third photon coupled isolator 100. The output 102 of photon coupled isolator 100 drives transistor 104 which in turn drives gate 106 and gate 108.

By providing appropriate disabling means 112 according to techniques well known in the art connected to correction rate generator 86 for manually disabling correction rate generator 86 in a preferred fail-safe condition and closing switch 76, the capability for operating switching to suppressed baseline mode operation when desired is provided. When correction rate generator 86 is manually disabled by disabling means 112, so that there is no output 88 therefrom, gate 108 closes switch 37, and switch 76 is closed putting the amplifier 34 in the suppressed baseline mode.

Figure 3:
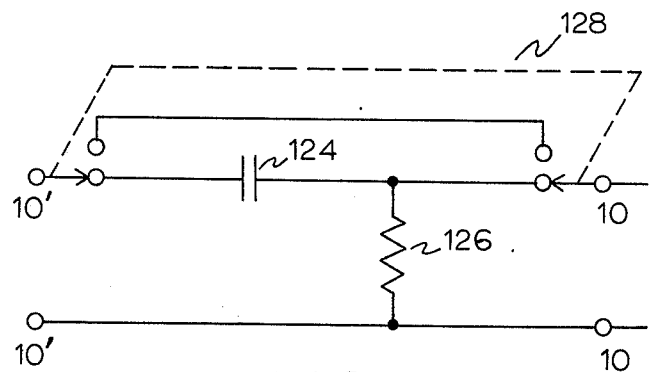
FIG. 3 is the preferred circuit needed to add the AC amplification mode.
Figure 4:
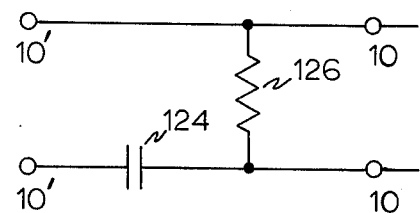
FIG. 4 is an alternate circuit for adding the AC amplification mode.

FIGS. 3 and 4 show optional methods of providing the AC amplification mode operation. To achieve this mode, an RC decoupling network is connected to inputs 10 providing a new point for the input signal at inputs 10'. A capacitor 124 is put in series with either of the input lines 10'-10 and a resistor 126 is connected across inputs 10. In the preferred embodiment of FIG. 3, operator activated switches 128 are provided to switch the input signal to pass through the decoupling network for AC amplification mode operation or around it, to provide an operator with AC or DC amplification mode selection capability.

Isolated power is provided to the input amplifiers 14, 42 and output amplifiers 58, 64, 70 by means of a transformer coupled DC to DC inverter generally designated as 114. A 30 KC square wave oscillator 116 drives a transformer 118 having two secondary windings 120 and 122. Transformer 18 with two separate secondary windings 120, 122 provides the required isolation. The first secondary 120 provides power for the input amplifier section containing amplifiers 14 and 42 and their associated circuitry. The 30 KC square wave from oscillator 116 is rectified and filtered by well known techniques to provide negative and positive 15 volts. Zener diodes are used to provide additional output voltages of negative and positive 6.8 volts. The second secondary 122 proves negative and positive 3.4 volts for the output amplifiers 58, 64 and 70 along with their associated circuitry. One convenient method for accomplishing this is to have a zener diode regulate the total voltage to 6.8 volts and to employ a center tapped output in a voltage divider in a manner well nown to those skilled in the art. Additionally, RF chokes should be provided according to well known techniques to prevent high frequency interference from reaching the input to oscillator 116 and causing interaction between other equipment operating on the same primary power supply.

It is to be understood that while photon isolators are shown at 46, 48 and 100 of FIG. 2, any appropriate isolation means (e.g. magnetic, capacitive) could be substituted. Should isolation means other than photon couplers be employed, the offset compensation loop comprising integrator 82, phase inverter 84 and associated circuitry would probably be an optional item which could possibly be removed without excessive adverse results.

Having thus described my invention, I claim:

1. An improved solid state amplifier comprising:
   a. solid state amplifier means having an input stage and an output terminal, said input stage having a pair of input terminals connected across a summing junction and a feedback terminal for a correction factor whereby a feedback signal can be applied to said input stage to effect the balance across said summing junction;
   b. input circuit means for connecting a signal to be amplified to one of said pair of input terminals;
   c. signal feedback circuit means connected between said output terminal and the other of said input terminals, said signal feedback circuit means including a normally closed first switch means for periodically opening said signal feedback circuit means to disconnect the feedback signal therefrom;
   d. normally open second switch means connected between said pair of input terminals for periodically interconnecting said pair of input terminals;
   e. integrating circuit means for providing a correction factor connected between said output terminal and said feedback terminal for a correction factor, said integrating circuit means having an integrator with an input terminal and including a normally open third switch means disposed between said output terminal of said amplifier means and said input terminal of said integrator for periodically completing said connection to said output terminal;
   f. track and hold circuit means having an input terminal and an output terminal for tracking a signal applied to said input terminal and holding the instantaneous value of said input signal at said output terminal when said input signal is interrupted;
   g. connecting circuit means, including a normally closed fourth switch means interconnecting said output terminal of said amplifier means and said input terminal of said track and hold means;
   h. means for generating a correction rate signal; and
   i. first gate circuit means connected to said generating means and to said first, second, third and fourth switch means for periodically opening said first and fourth switch means and closing said second and third switch means placing the amplifier in a correction mode whereby the output of the amplifier will be maintained at its instantaneous value, said amplifier means will be put in a condition which will produce a zero output signal at said output terminal of said amplifier means if no unbalance across said summing junction is present, and the signal then present at said output terminal of said amplifier means will cause said integrating circuit means to integrate to a new correction factor level which will put said summing junction in a balanced condition.

2. An improved amplifier as claimed in claim 1 and additionally comprising:
   a. first switching circuit means connecting said output terminal of said amplifier means to said input terminal of said integrator and including normally open fifth switch means, said fifth switch means being closed when said correction rate generator is disabled to place the amplifier in a suppressed baseline mode of operation thereby bypassing said third switch means and establishing a long time constant integrator through said integrating circuit means;
   b. second gate circuit means interconnecting said fifth switch means and said correction rate generator for opening said fifth switch means when said correction rate generator is operating and closing said fifth switch means when said correction rate generator is disabled; and,
   c. means connected to said correction rate generator for disabling said correction rate generator.

3. An improved amplifier as claimed in claim 1 wherein said input circuit means includes an RC decoupling circuit comprising:
   a. a pair of signal terminals across which the signal to be amplified is applied;
   b. capacitance means connected in series with one of said pair of signal terminals; and,
   c. resistance means interconnecting said pair of signal terminals.

4. An improved amplifier as claimed in claim 2 wherein said input circuit means includes an RC decoupling circuit comprising:
   a. a pair of signal terminal across which the signal to be amplified is applied;
   b. capacitance means connected in series with one of said pair of signal terminals; and,
   c. resistance means interconnecting said pair of signal terminals.

5. An improved solid state amplifier comprising:
   a. solid state amplifier means having an input stage and an output terminal, said input stage having a pair of input terminals connected across a summing junction and a feedback terminal for correction factor whereby a feedback signal can be applied to said input stage to effect the balance across said summing junction;
   b. input circuit means for connecting a signal to be amplified to one of said pair of input terminals;
   c. signal feedback circuit means connected between said output terminal and the other of said input terminals, said signal feedback circuit means including a normally closed first switch means for periodically opening said signal feedback circuit means to disconnect the feedback signal therefrom;
   d. normally open second switch means connected between said pair of input terminals for periodically interconnecting said pair of input terminals;
   e. integrating circuit means for providing a correction factor connected between said output terminal and said feedback terminal for a correction factor, said integrating circuit means having an integrator with an input terminal and including a normally open third switch means disposed between said output terminal of said amplifier means and said input terminal of said integrator for periodically completing said connection to said output terminal;
   f. track and hold circuit means having an input terminal and an output terminal for tracking a signal applied to said input terminal and holding the instantaneous value of said input signal at said output terminal when said input signal is interrupted;
   g. connecting circuit means interconnecting said output terminal of said amplifier means and said input terminal of said track and hold means, said connecting circuit means including a normally closed fourth switch means and further including first means for isolation disposed between said output terminal of said amplifier means and said fourth switch means;

h. means for generating a correction rate signal; and, i. first gate circuit means connected to said generating means and to said first, second, third and fourth switch means for periodically opening said first and fourth switch means and closing said second and third switch means placing the amplifier in a correction mode whereby the output of the amplifier will be maintained at its instantaneous value, said amplifier means will be put in a condition which will produce a zero output signal at said output terminal of said amplifier means if no unbalance across said summing junction is present, and the signal then present at said output terminal of said amplifier means will cause said integrating circuit means to integrate to a new correction in a balanced condition.

6. An improved amplifier as claimed in claim 5 and additionally comprising:

a. first switching means connecting said output terminal of said amplifier means to said input terminal of said integrator and including normally open fifth switch means for bypassing said third switch means to establish a continuing long time constant integrator through said integrating circuit means when said correction rate generator is disabled therebyh placing the amplifier in a suppressed baseline mode of operation;

b. second gate circuit means interconnecting said fifth switch means and said correction rate generator for opening said fifth switch means when said correction rate generator is operating and closing said fifth switch means when said correction rate generator is disabled; and, c. means connected to said correction rate generator for disabling said correction rate generator.

7. An improved amplifier as claimed in claim 5 wherein said input circuit means includes an RC decoupling circuit comprising:

a. a pair of signal terminals across which the signal to be amplified is applied;

b. capacitance means connected in series with one of said pair of signal terminals; and, c. resistance means interconnecting said pair of signal terminals.

8. An improved amplifier as claimed in claim 6 wherein said input circuit means includes an RC decoupling circuit comprising:

a. a pair of signal terminals across which the signal to be amplified is applied;

b. capacitance means connected in series with one of said pair of signal terminals; and, c. resistance mans interconnecting said pair of signal terminals.

9. An improved solid state amplifier comprising:

a. a solid state amplifier means having an input stage and an output terminal, said input stage having a pair of input terminals connected across a summing junction and a feedback terminal for a correction factor whereby a feedback signal can be applied to said input stage to effect the balance across said summing junction;

b. input circuit means for connecting a signal to be amplified to one of said pair of input terminals;

c. signal feedback circuit means connected between said output terminal and the other of said input terminals, said signal feedback circuit means including a normally closed first switch means for periodically opening said signal feedback circuit means to disconnect the feedback signal therefrom;

d. normally open second switch means connected between said pair of input terminals for periodically interconnecting said pair of input terminals;

e. integrating circuit means for providing a correction factor connected between said output terminal and said feedback terminal for a correction factor, said integrating circuit means having an integrator with an input terminal and including a normally open third switch means disposed between said output terminal of said amplifier means and said input terminal of said integrator for periodically completing said connection to said output terminal;

f. track and hold circuit means having an input terminal and an output terminal for tracking a signal applied to said input terminal and holding the instantaneous value of said input signal at said output terminal when said input signal is interrupted;

g. connecting circuit means interconnecting said output terminal of said amplifier means and said input terminal of said track and hold means, said connecting circuit means including a normally closed fourth switch means and further including a photon coupler disposed between said output terminal of said amplifier means and said fourth switch means;

h. means for generating a correction rate signal; and, i. first gate circuit means connected to said generating means and to said first, second, third and fourth switch means for periodically opening said first and fourth switch means and closing said second and third switch means placing the amplifier in a correction mode whereby the output of the amplifier will be maintained at its instantaneous value, said amplifier means will be put in a condition which will produce a zero output signal at said output terminal of said amplifier means if no unbalance across said summing junction is present, and the signal then present at said output terminal of said amplifier means will cause said integrating circuit means to integrate to a new correction factor level which will put said summing junction in a balanced condition.

10. An improved amplifier as claimed im claim 9 and additionally comprising:

a. first switching circuit means connecting said output terminal of said amplifier means to said input terminal of said integrator and including normally open fifth switch means for bypassing said third switch means to establish a continuing long time constant integrator through said integrating circuit means when said correction rate generator is disabled thereby placing the amplifier in a suppressed baseline mode of operation;

b. second gate circuit means interconnecting said fifth switch means and said correction rate generator for opening said fifth switch means when said correction rate generator is operating and closing said fifth switch means when said correction rate generator is disabled; and, c. means connected to said correction rate generator for disabling said correction rate generator.

11. An improved amplifier as claimed in claim 9 wherein said input circuit means includes an RC decoupling circuit comprising:
 a. a pair of signal terminals across which the signal to be amplified is applied;
 b. capacitance means connected in series with one of said pair of signal terminals; and,
 c. resistance means interconnecting said pair of signal terminals.

12. An improved amplifier as claimed in claim 10 wherein said input circuit means includes an RC decoupling circuit comprising:
 a. a pair of signal terminals across which the signal to be amplified is applied;
 b. capacitance means connected in series with one of said pair of signal terminals; and,
 c. resistance means interconnecting said pair of signal terminals.

13. An improved solid state amplifier comprising:
 a. solid state amplifier means having an input stage and an output terminal, said input stage having a pair of input terminals connected across a summing junction and a feedback terminal for a correction factor whereby a feedback signal can be applied to said input stage to effect the balance across said summing junction;
 b. input circuit means for connecting a signal to be amplified to one of said pair of input terminals;
 c. signal feedback circuit means connected between said output terminal and the other of said input terminals, said signal feedback circuit means including a normally closed first switch means for periodically opening said signal feedback circuit means to disconnect the feedback circuit means to disconnect the feedback signal therefrom;
 d. normally open second switch means connected between said pair of input terminals for periodically interconnecting said pair of input terminals;
 e. integrating circuit means for providing a correction factor connected between said output terminal and said feedback terminal for a correction factor, said integrating circuit means having an integrator with an input terminal and including a normally open third switch means disposed between said output terminal of said amplifier means and said input terminal of said integrator for periodically completing said connection to said output terminal;
 f. track and hold circuit means having an input terminal and an output terminal for tracking a signal applied to said input terminal and holding the instantaneous value of said input signal at said output terminal when said input signal is interrupted;
 g. isolation amplifier means having a pair of input terminals and an output terminal;
 h. normally closed fourth switch means connected between said output terminal of said amplifier means and one of said input terminals of said isolation amplifier means for periodically opening said connection between said amplifier means and said isolation amplifier means;
 i. normally open fifth switch means connected between said pair of input terminals of said isolation amplifier means for periodically interconnecting said pair of input terminals;
 j. first photon coupler means for isolation having an input terminal and an output terminal, said input terminal of said first photon coupler isolation means being connected to said output terminal of said isolation amplifier means;
 k. output amplifier means having an input terminal and an output terminal, said input terminal of said output amplifier means being connected to said output terminal of said photon coupler isolation means;
 l. connecting circuit means, including a normally closed sixth switch means interconnecting said output terminal of said output amplifier and said input terminal of said track and hold circuit means;
 m. inverting signal feedback circuit means connected between said output terminal of said output amplifier means and said input terminal of said output amplifier means, said inverting signal feedback circuit means including a normally open seventh switch means for periodically closing said inverting signal feedback circuit to connect the inverted feedback signal to said input terminal of said output amplifier;
 n. means for generating a correction rate signal;
 o. first gate circuit means connected to said generating means and to said first, second, third and sixth switch means for periodically opening said first and sixth switch means and closing said second and third switch means placing the amplifier in a correction mode whereby the output of the amplifier will be maintained at its instantaneous value, said amplifier means will be put in a condition which will produce a zero output signal at said output terminal of said amplifier means if no unbalance across said summing junction is present, and the signal then present at said output terminal of said amplifier means will cause said integrating circuit means to integrate to a new correction factor level which will put said summing junction in a balanced condition; and,
 p. second gate circuit means connected to said generating means and said switch means for periodically opening said fourth switch means and closing said fifth and seventh switch means when the amplifier is placed in the correction mode, said second gate circuit means including second photon coupler means for isolation disposed between generating means and said first, second, third, fourth and seventh switch means.

14. An improved amplifier as claimed in claim 13 and additionally comprising:
 a. first switching circuit means connecting said output terminal of said amplifier means to said input terminal of said integrator and including normally open eighth switch means for bypassing said third switch means to establish a long time constant integrator through said integrating circuit mans when said correction rate generator is disabled thereby placing the amplifier in a suppressed baseline mode of operation;
 b. third gate circuit means interconnecting said eighth switch means and said correction rate generator for opening said eighth switch means when said correction rate generator is operating and closing said eighth switch means when said correction rate generator is disabled;
 c. means connected to said correction rate generator for disabling said correction rate generator; and, d. second switching circuit means connected in parallel with said seventh switch means and connected to said disablsing means, said second switching circuit means including normally open ninth switch means for bypassing said seventh switch means to establish a long time constant integrator through said inverting signal feedback circuit means when said correction rate generator is disabled.

15. An improved amplifier as claimed in claim 13 wherein said input circuit means includes an RC decoupling circuit comprising:
  a. a pair of signal terminals across which the signal to be amplified is applied;
  b. capacitance means connected in series with one of said pair of signal terminals; and,
  c. resistance means interconnecting said pair of signal terminals.

16. An improved amplifier as claimed in claim 14 wherein said input circuit means includes an RC decoupling circuit comprising:
  a. a pair of signal terminals across which the signal to be amplified is applied;
  b. capacitance means connected in series with one of said pair of signal terminals; and,
  c. resistance means interconnecting said pair of signal terminals.

* * * * *

UNITED STATES PATENT AND TRADEMARK OFFICE
CERTIFICATE OF CORRECTION

PATENT NO. : 4,025,869
DATED : May 24, 1977
INVENTOR(S) : Leland Bryan Smith

It is certified that error appears in the above-identified patent and that said Letters Patent are hereby corrected as shown below:

| | |
|---|---|
| Column 9, line 20 | after the word "correction" insert --factor level which will put said summing junction-- |
| Column 9, line 24 | after the word "switching" insert --circuit-- |
| Column 9, line 30 | "therebyh" should be deleted and the word --thereby-- should be inserted |
| Column 9, line 57 | "mans" should be deleted and the word --means-- should be inserted |
| Column 9, line 60 | "a" (second occurrence) should be deleted |
| Column 10, line 52 | "im" should be deleted and the word --in-- should be inserted |
| Column 11, lines 36 and 37 | "circuit means to disconnect the feedback" should be deleted |

UNITED STATES PATENT AND TRADEMARK OFFICE
CERTIFICATE OF CORRECTION

PATENT NO. : 4,025,869

DATED : May 24, 1977

INVENTOR(S) : Leland Bryan Smith

It is certified that error appears in the above—identified patent and that said Letters Patent are hereby corrected as shown below:

Column 12, line 57    "mans" should be deleted and the word --means-- should be inserted Column 13, line 3     "disablsing" should be deleted and the word --disabling-- should be inserted Signed and Sealed this First Day of April 1980

[SEAL]

Attest:

SIDNEY A. DIAMOND

Attesting Officer    Commissioner of Patents and Trademarks